United States Patent [19]

Bosnyak

[11] Patent Number: 4,859,874
[45] Date of Patent: Aug. 22, 1989

[54] PLA DRIVER WITH RECONFIGURABLE DRIVE

[75] Inventor: Robert J. Bosnyak, Portland, Oreg.

[73] Assignee: Fairchild Semiconductor Corp., Cupertino, Calif.

[21] Appl. No.: 101,210

[22] Filed: Sep. 25, 1987

[51] Int. Cl.$^4$ .................. H03K 17/08; H03K 17/10; H03K 17/687; G11C 7/00
[52] U.S. Cl. .................. 307/296.3; 307/466; 307/270; 307/202.1; 365/226; 365/104
[58] Field of Search ............ 307/570, 571, 575, 576, 307/577, 270, 264, 296.3, 296.1, 475, 450, 451, 579, 585, 465, 466, 296.6, 202.1; 365/226, 104, 228

[56] References Cited

U.S. PATENT DOCUMENTS 4,701,636 10/1987 Millhollan et al. ............ 307/466 X
4,722,822 2/1988 Thai et al. ...................... 365/226 X Primary Examiner—Stanley D. Miller
Assistant Examiner—David R. Bertelson
Attorney, Agent, or Firm—Steven F. Caserza; Lee Patch

[57] ABSTRACT

In accordance with the teachings of this invention, a novel PLA row driver circuit is provided which utilizes a minimum number of components, thereby minimizing integrated circuit surface area, and thus reducing cost, and minimizing stray capacitance, thereby increasing speed of operation. Furthermore, in accordance with the teachings of this invention, a circuit is provided which, while utilizing a minimum number of components, provides a first VOL level to the row line during normal operation of the device, and a second, higher VOL level to the row line during programming.

11 Claims, 4 Drawing Sheets

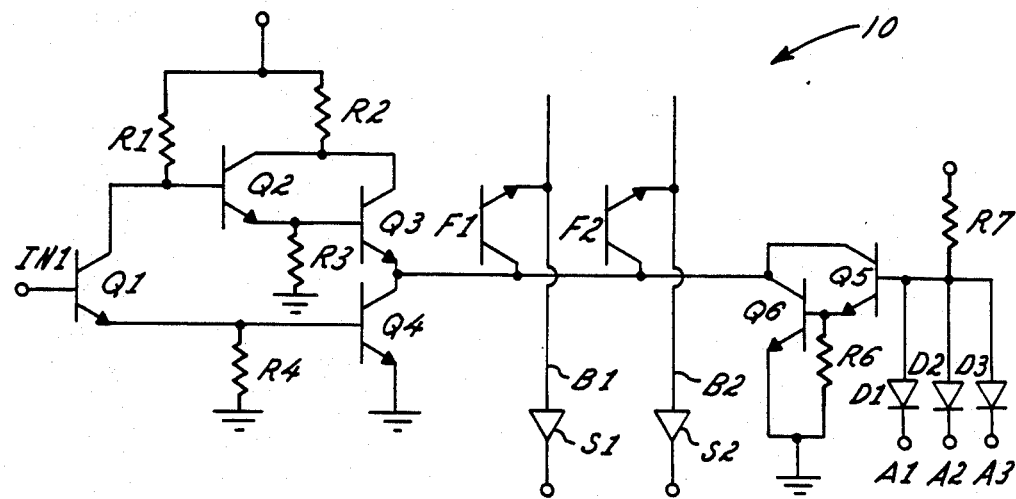
FIG. 5 (PRIOR ART)
FIG. 6a
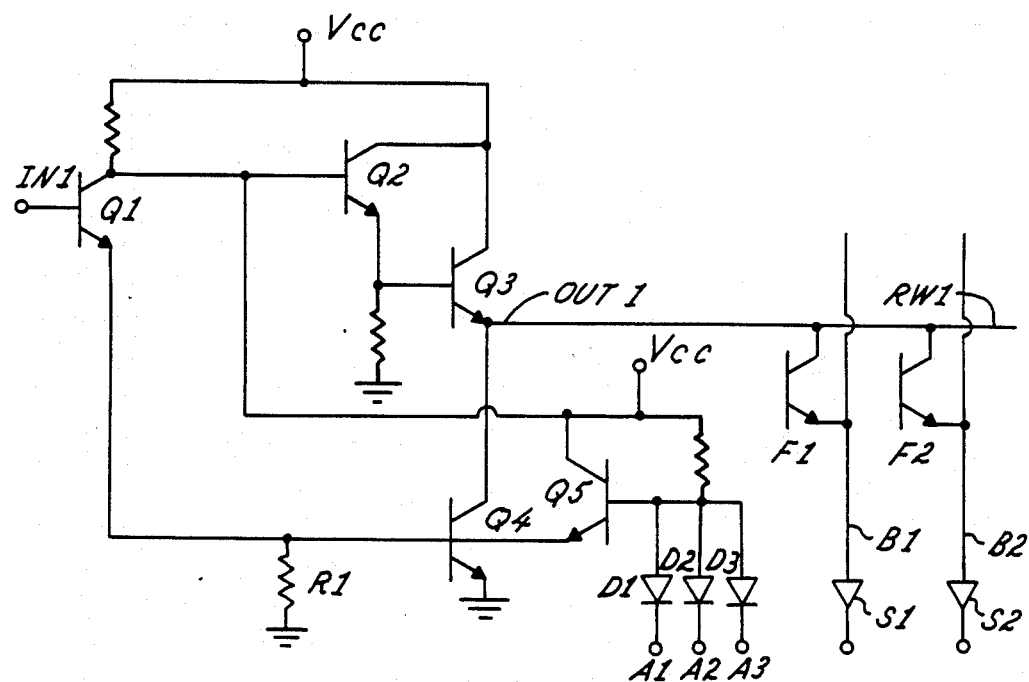

PLA DRIVER WITH RECONFIGURABLE DRIVE

BACKGROUND OF THE INVENTION

This invention relates to programmable logic array drivers, and in particular to a programmable logic array driver which provides a first drive capability to a row line during normal operation of the device, and a second drive capability to the row line during programming, as well as optimal low voltage output (VOL) levels for both normal and programming modes.

Programmable logic arrays (PLAs) are well known in the prior art. They include an array of programmable elements which may comprise, for example, fuses made of titanium tungsten, nichrome, or polycrystalline silicon, or transistor devices capable of being shorted when a programming current is applied. Such an array of programmable elements, arranged in a pattern of rows and columns, is programmed by a user to provide a specific pattern for providing desired output signals in response to input signals.

Such programmable logic array devices include a number of PLA drivers for driving the row lines. These drivers must accomplish two tasks. First, during normal operating conditions, they must provide a logical one or logical zero signal to the row line, depending upon the state of a related input signal. A sense amplifier is connected to the bit lines to determine if the programmable element located at the intersection of a row line and bit line has or has not been programmed.

Secondly, during programming, the PLA driver must provide sufficient current to the row line to cause a selected programmable element to be programmed. Of importance, the amount of current required to be supplied by the PLA driver to the row line is considerably less during normal operation (typically 20-30 milliamps) as compared with the current required to be provided to a row line during programming (typically 60 milliamps).

A simple form of row driver is a standard TTL totem pole output stage, as shown in FIG. 1, which can be made to provide adequate current to row line R1 during programming and during normal operation, although this requires a considerable amount of power during the programming mode. However, this rather simple PLA driver structure has inherent disadvantages. For example, since this type of PLA driver must sink large amounts of current in the programming mode, it will sink approximately 60 ma in both the programming and normal operating modes of the device. In addition, this type of PLA driver is inherently slow during normal operation of the device, since its components must be large and therefore have relatively large capacitance.

Another prior art PLA row driver is shown in FIG. 2. This PLA driver includes a TTL totem pole output circuit, plus the addition of Schottky diode 21 or similar device connected between the base of transistor 22 and output terminal 23. When the output signal on terminal 23 connected to row line RW1 goes low due to conduction of pull-down transistor 24, diode 21 becomes forward biased, thereby reducing the signal applied to the base of transistor 22, which in turn reduces the drive available to pull-down transistor 24. This voltage feedback provided by the addition of diode 21 reduces the drive to pull-down transistor 24 when the output signal on terminal 23 reaches the logical zero level, thereby keeping transistor 22 operating in the linear mode. Phase splitter transistor 26 provides voltage levels required to operate pullup transistor 27. Thus the circuit of FIG. 2 keeps transistor 22 operating in the linear mode, reducing base drive to pull-down transistor 24, allowing transistor 24 to turn off more rapidly.

However, the circuit of FIG. 2 suffers from transient ringing of the output signal on terminal 23 due to the phase lag of signals propagated through the feedback loop provided by diode 21. Transient ringing on a signal makes it difficult to determine the level of the signal, since its voltage is changing. In the circuit of FIG. 2, the logical zero output signal VOL on terminal 23 is equal to $V_{be}(Q24)$ plus $V_{be}(Q22)$ minus $V_D(D21)$, or about 1.0 to 1.2 volts. This VOL signal is relatively high, which must be properly sensed by a sense amplifier (e.g., sense amplifiers S1 and S2 connected to monitor levels on bit lines B1 and B2, respectively) reducing the voltage swing between a logical zero and a logical one. Furthermore, this VOL level is temperature dependent, since it is dependent on $V_{be}$ which, as is well known, is itself dependent on temperature. This circuit provides a logical one voltage level VOH approximately equal to $V_{cc}V_{be}(Q27)-V_D(D28)$. Particularly at low temperatures, the transition between VOL and VOH becomes rather small, requiring a more sensitive sense amplifier connected to each bit line to properly distinguish between a logical zero and a logical one.

In an alternative form of prior art PLA row driver (FIG. 3), two separate pull-down transistors Q4 and Q6 are used in a TTL totem pole row driver configuration. Programming pull-down transistor Q6 is a large device which is enabled during programming in order to sink a sufficient amount of current in order to program programmable elements F1, F2 connected to row line RW1. Normal operation pull-down transistor Q4 is smaller in size than programming pull-down transistor Q6 and is enabled during normal operation. Although a larger transistor Q6 is utilized for programming, it is still connected to row line RW1, and thus its capacitance remains connected to row line RW1 during normal operation, thereby having a detrimental effect on speed during normal operation. However, utilizing this type of prior art PLA row driver, power consumption is reduced and two separate VOL levels are achieved, one associated with normal operation of the device, and the other associated with programming. However, in a PLA device, the current which must be sunk by a row driver during normal operation can be relatively high, due to a relatively large number of programmable elements which may be connected to the row line at any given time. This prior art approach is more suitable for use in programmable read only memories (PROMs) in which during the read operation only a single programmable element, at most, will conduct current to the row line driver. Thus, in PROMs, the pull-down transistor used during normal operation can be made extremely small, thereby providing a significant speed and area advantage, far greater than is possible when using this technique to provide a row driver for use in a PLA. While this technique is operable in PLAs, it adds additional area to an integrated circuit device, as well as adding additional stray capacitances.

In another prior art PLA driver (FIG. 4), the pull-down transistor of a standard TTL totem pole is replaced by a Darlington pair (Q50, Q51). The Darlington pair allows a single transistor set to perform the pull-down function during both normal operating and programming modes. Unfortunately, wih this circuit during normal operation a logical zero on row line RW1 is equal to $V_{be}(Q50) + V_{sat}(Q51)$, or about 1.0 to 1.2 volts. This is an undesirably high threshold level for a logical zero signal during normal operation. During normal operation, this relatively high voltage level associated with a logical zero limits the operating range of the device by reducing the voltage margins of the circuit. However, this logical zero level has an advantage during programming by making the device less prone to latch-up caused by conduction of parasitic SCR devices which are inherently formed between the semiconductor tubs containing adjacent rows.

Another prior art PLA driver is shown in the schematic diagram of FIG. 5. This prior art circuit uses two separate subcircuits for driving row line RW1, one for normal operation and one for programming. PLA driver 10 of FIG. 5 includes a standard TTL totem pole driver circuit formed by transistors Q1, Q2, Q3, and Q4 together with associated components in order to drive row line RW1 during normal operation of the device. As shown in FIG. 5, fuse devices F1 and F2 are connected between row line RW1 and bit lines B1 and B2, respectively, Thus, during normal operation, the TTL totem pole circuit provides the appropriate logic level to row line RW1 in response to the logic level of the input signal applied to input terminal IN1, in much the same manner as in the circuit of FIG. 1. During programming, PLA driver 10 uses the Darlington pair formed by transistors Q5 and Q6 to drive row line RW1. Darlington pair Q5, Q5 turns on when the base of transistor Q5 is held high by the address signals applied to the decoding circuitry formed by diodes D1, D2, D3 and resistor R7 connected to $V_{cc}$.

In this manner a single, standard TTL pull-down device Q4 is used to pull-down row line RW1 as needed during normal operation, and Darlington pair Q5, Q6 is used to pull-down row line RW1 during programming. During normal operation, a logical zero on row line RW1 is equal to $V_{sat}(Q4)$; during programming a logical zero on row line RW1 is equivalent to $V_{sat}(Q5) + V_{be}(Q6)$. The disadvantage of the circuit of FIG. 5 is that three transistors (Q4, Q5 and Q6) are required to pull down row line RW1: transistor Q4 during normal operation and transistors Q5 and Q6 during programming. This requires additional surface area on the integrated circuit and adds stray capacitance to the device. Furthermore, transistors Q4 and Q6 are both rather large, requiring additional surface area and adding capacitance to row line RW1 with a corresponding decrease in speed.

SUMMARY

In accordance with the teachings of this invention, a novel PLA row driver circuit is provided which utilizes a minimum number of components, thereby minimizing integrated circuit surface area, and thus reducing cost, and minimizing stray capacitance, thereby increasing speed of operation. Furthermore, in accordance with the teachings of this invention, a circuit is provided which, while utilizing a minimum number of components, provides a first VOL level to the row line during normal operation of the device, and a second, higher VOL level to the row line during programming. In one embodiment, a row driver circuit comprises a row addressing input terminal for receiving an input signal, a program enable means for providing a program enable signal, an output terminal for providing a drive signal to a row in an array, pull up means for providing a pull up voltage level to said output terminal in response to a first state of said input signal, pull down means for providing a first pull down voltage level to said output terminal in response to a second state of said input signal, said pull down means comprising a first transistor having a first current carrying terminal connected to said output terminal, a second current carrying terminal connected to a pull down voltage source, and having a control terminal, and pull down control means for controlling said pull down means, causing said pull down means to provide a second pull down voltage level to said output terminal in response to said program enable signal, and wherein said pull down control means comprises a second transistor having a first current carrying terminal connected to a supply voltage, a second current carrying terminal connected to said control terminal of said first transistor, and a control terminal responsive to said program enable signal.

BRIEF DESCRIPTION OF THE DRAWINGS

FIG. 5 is yet another example of a prior art PLA row driver;

FIG. 6a is a schematic diagram of one embodiment of a PLA row driver constructed in accordance with the teachings of this invention;

DETAILED DESCRIPTION

FIG. 6a is a schematic diagram of one embodiment of a PLA driver circuit constructed in accordance with the teachings of this invention, which includes a single row driver circuit capable of providing a first VOL level during normal operation and a second VOL level during programming. Row addressing input terminal IN1 receives an input signal during normal operation of the device, and transistors Q2, Q3, and Q4 form a typical TTL totem pole output stage for driving row line RW1 normal operation, via output terminal OUT1. However, transistor Q4 also serves, together with transistor Q5, as a Darlington pair used as a current sink during programming of fuses F1 and F2 connected to row line RW1. Programming address terminals A1 through A3, together with decoding diodes D1 through D3, respectively, serve to enable the Darlington pair formed by transistors Q4 and Q5 during programming by providing a programming enable signal to the base of transistor Q5. In this manner, a single device Q4 serves both during programming and normal operation of the device, thereby saving integrated circuit area and minimizing stray capacitance.

Figure 1:
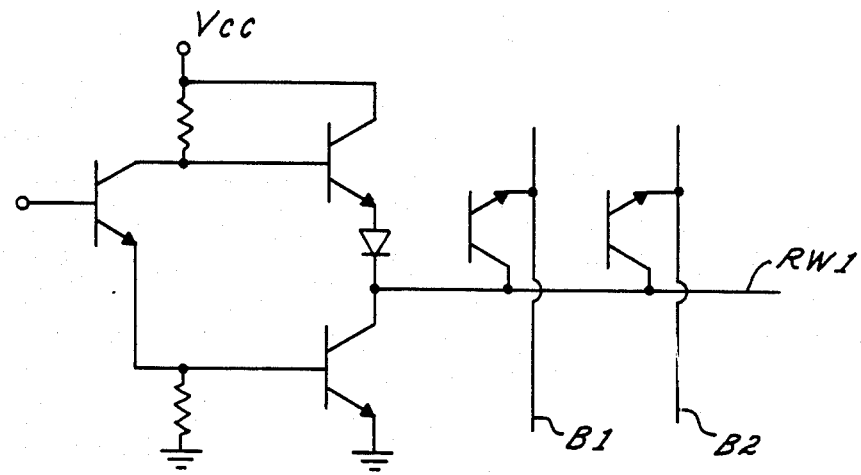
FIG. 1 is a schematic diagram of a typical prior art PLA row driver.
Figure 2:
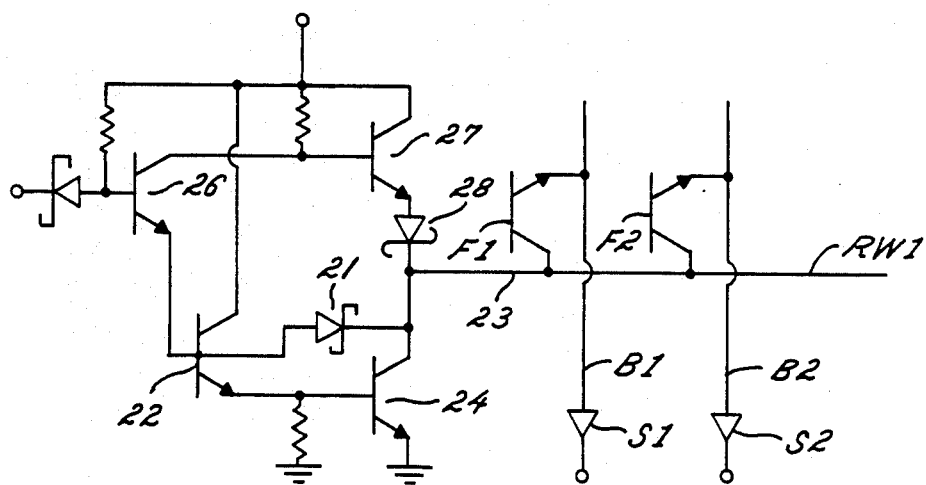
FIG. 2 is a schematic diagram of another prior art PLA row driver.
Figure 3:
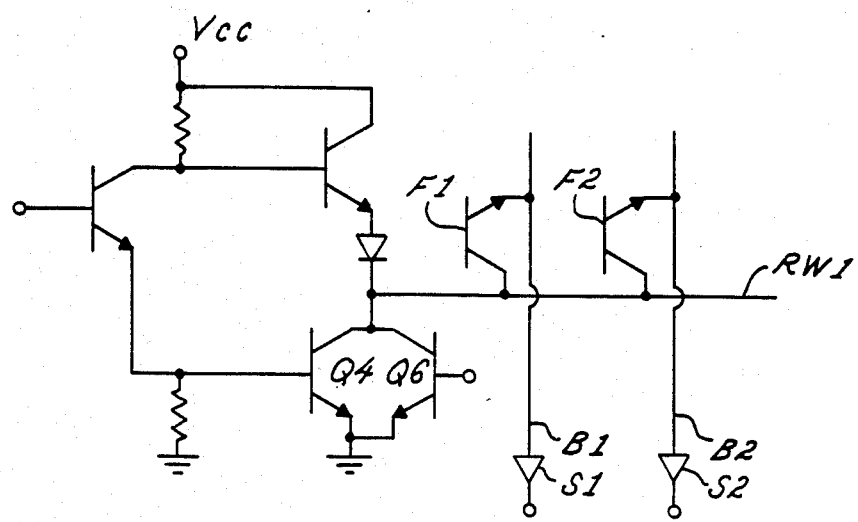
FIG. 3 is a schematic diagram of another prior art PLA row driver.
Figure 4:
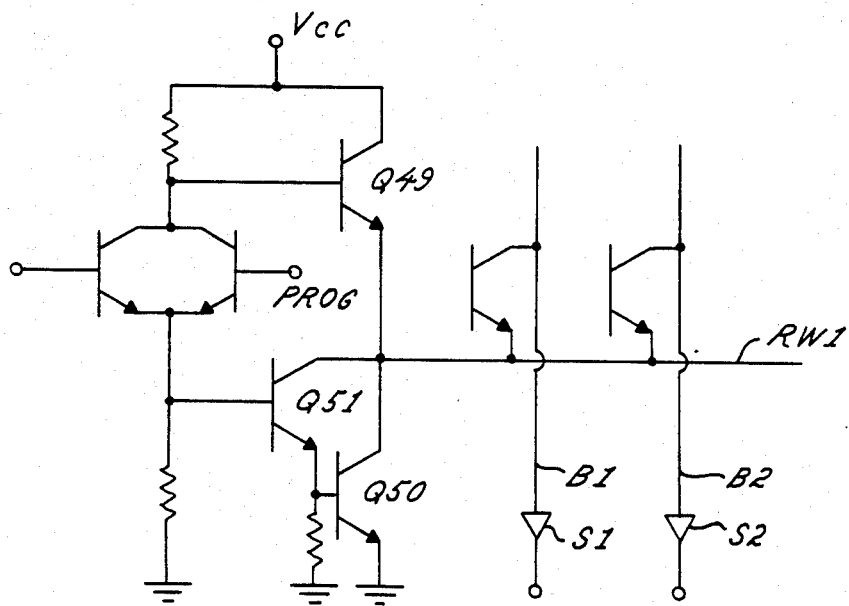
FIG. 4 is a schematic diagram of a PLA row driver of the prior art.
Figure 6B:
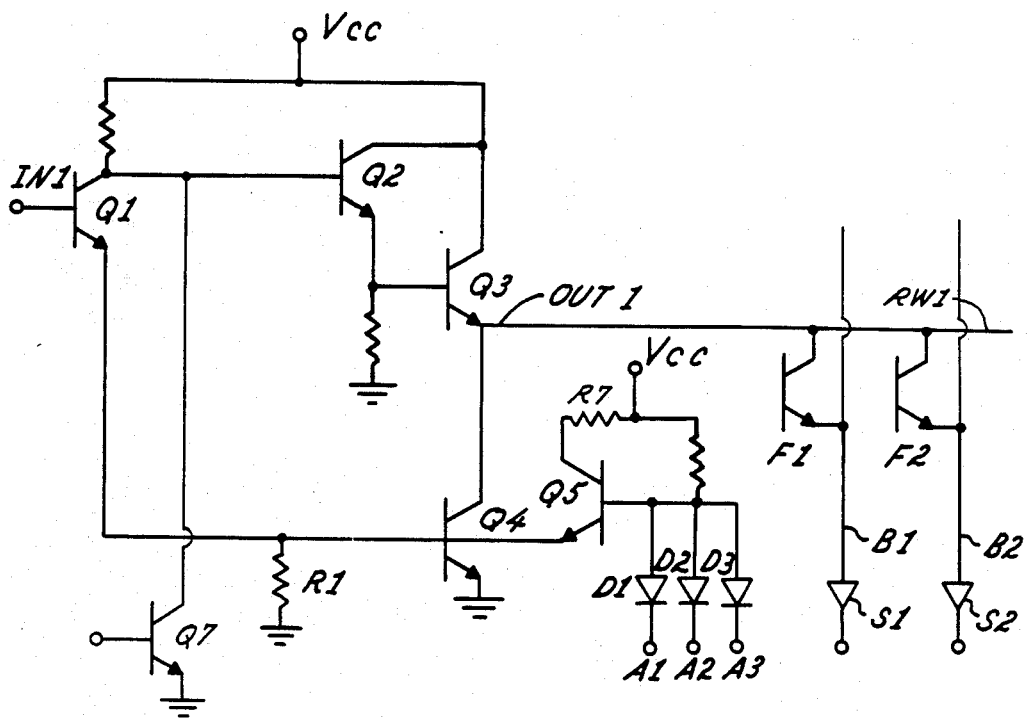
FIG. 6b is a schematic diagram of an alternative embodiment of a PLA row driver constructed in accordance with the teachings of this invention.

FIG. 6b is a schematic diagram of another example of a PLA row driver constructed in accordance with the teachings of this invention. The circuit of FIG. 6b operates in much the same manner as the circuit of FIG. 6a, previously described. However, as shown in FIG. 6b, in this embodiment an additional transistor Q7 is provided having its collector connected to the collector of phase splitter transistor Q1. The base of transistor Q7 receives a signal which causes transistor Q7 to turn on during programming. This causes the collector of phase splitter transistors Q1 to be pulled low, thereby ensuring that transistors Q2 and Q3 remain off, as desired. Also in this embodiment, the collector of transistor Q5 is connected to $V_{cc}$ via resistor R7.

Figure 7:
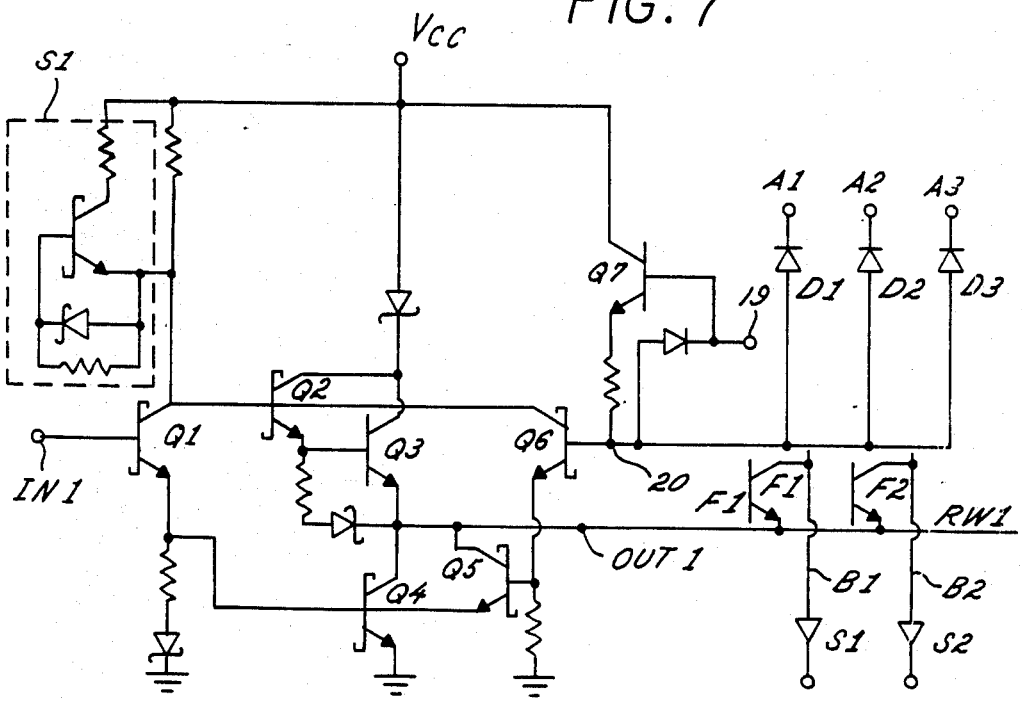
FIG. 7 is a schematic diagram of another embodiment of a PLA row driver constructed in accordance with the teachings of this invention.

FIG. 7 shows a schematic diagram of another embodiment of a driver circuit constructed in accordance with the teachings of this invention. During normal operating conditions, transistor Q5 is disabled with a low signal applied to program enable lead 19. This low program enable signal pulls the base of transistor Q6 low, preventing base drive from being applied to transistor Q5. During normal operating conditions, the input signal is applied to row addressing input terminal IN1, operating phase splitter transistor Q1. Transistors Q2 and Q3 form a Darlington pair pull-up means, and transistor Q4 forms a pull-down means, for driving row line RW1 via output terminal OUT1. During programming, a high programming enable signal is applied to terminal 19, turning on transistor Q7 and providing current to node 20. Programming address signals A1 through A3 are applied to decoding diodes D1 through D3, respectively. When the address formed by signals A1 through A3 indicates that a programmable element on row line RW1 is to be programmed, diodes D1 through D3 do not conduct, and current from transistor Q7 is available to drive the base of transistor Q6. This causes transistor Q6 to turn on, in turn causing transistor Q5 to turn on, providing base drive to pulldown transistor Q4. Thus, in accordance with the teachings of this invention, Q4 serves as a single transistor pull-down means in normal operation, and transistors Q5 and Q4 form a Darlington pair to serve as a pull-down means during programming. In this manner, a single transistor Q4 serves as the actual pulldown current path during both programming and normal operation, thereby minimizing semiconductor device area, and associated stray capacitances. Furthermore, in accordance with the teachings of this invention, during normal operation, the logical zero (VOL) voltage applied to row line RW1 during normal operation is equal to $V_{sat}(Q4)$, the saturation voltage of pull-down transistor Q4, typically about 0.3 volts. However, during programming, the logical zero level applied to row line RW1 is equal to $V_{be}(Q4)+V_{sat}(Q5)$, or about 1.0 to 1.2 volts, a very desirable result.

Also shown in FIG. 7 is subcircuit S1, which serves as a transient drive means, which is more fully described in a copending U.S. Patent Application on an invention of Bosnyak and Huard entitled, "PLA Driver With Increased Transient Drive", which is hereby incorporated by reference. However, the teachings of this invention are equally applicable to PLA drivers whether or not they utilize transient drive means such as subcircuit S1.

The invention now being fully described, it will be apparent to one of ordinary skill in the art that many changes and modifications can be made thereto without departing from the spirit or scope of the appended claims.

What is claimed is:
1. A row driver circuit comprising:
a row addressing input terminal for receiving an input signal;
a program enable means for providing a program enable signal;
an output terminal for providing a drive signal to a row in an array;
pull up means for providing a pull up voltage level to said output terminal in response to a first state of said input signal;
pull down means for providing a first pull down voltage level to said output terminal in response to a second state of said input signal, said pull down means comprising a first transistor having a first current carrying terminal connected to said output terminal, a second current carrying terminal connected to a pull down voltage source, and having a control terminal; and
pull down control means for controlling said pull down means, causing said pull down means to provide a second pull down voltage level to said output terminal in response to said program enable signal, and wherein said pull down control means comprises a second transistor having a first current carrying terminal connected to a supply voltage, a second current carrying terminal connected to said control terminal of said first transistor, and a control terminal responsive to said program enable signal.

2. A row driver circuit as in claim 1 wherein said second pull down voltage level is greater than said first pull down voltage level.

3. A row driver circuit as in claim 2 wherein said first and second transistors are bipolar transistors which operate as a Darlington pair in response to said programming enable signal.

4. A row driver circuit as in claim 3 wherein said first pull down voltage is approximately equal to the saturation voltage of said first transistor and said second pull down voltage is approximately equal to the saturation voltage of said first transistor plus the base-emitter voltage drop of said second transistor.

5. A PLA driver circuit comprising:
a row addressing input terminal for receiving an input signal;
an output terminal for providing a drive signal to a row in an array;
program enable means for providng a program enable signal;
a first transistor connected to said output terminal for providing a first voltage to said output terminal in response to a first state of said input signal;
a second transistor connected to said output terminal for providing a second voltage to said output terminal in response to a second state of said input signal;
control means responsive to said input signal for controlling the operation of said first and second transistors in response to said input signal; and
a third transistor which provides a control signal to said second transistor in response to said program enable signal, thereby causing said second transistor to provide a third voltage to said output terminal.

6. A row driver circuit as in claim 5 wherein said third voltage is greater than said second voltage.

7. A row driver circuit as in claim 6 wherein said second and third transistors are bipolar transistors which operate as a Darlington pair in response to said program enable signal.

8. A row driver circuit as in claim 7 wherein said second voltage is approximately equal to the saturation voltage of said second transistor and said third voltage is approximately equal to the saturation voltage of said second transistor plus the baseemitter voltage drop of said third transistor.

9. A row driver comprising:
an output terminal;
a first input terminal for receiving a first enable signal during a first operating mode;
a second input terminal for receiving a second enable signal during a second operating mode; and
pull down means for providing a first low voltage level on said output terminal in response to said first enable signal and a second low voltage level on said output terminal in response to said second enable terminal.

10. A row driver circuit as in claim 1 wherein said second low voltage level is greater than said first low voltage level.

11. A row driver circuit as in claim 10 wherein said first enable signal is received during normal operation and said second enable signal is received during programming.

* * * * *